(12) United States Patent
Choi

(10) Patent No.: US 6,873,566 B2
(45) Date of Patent: Mar. 29, 2005

(54) SEMICONDUCTOR MEMORY DEVICE

(75) Inventor: Gug Seon Choi, Seoul (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/615,237

(22) Filed: Jul. 9, 2003

(65) Prior Publication Data

US 2004/0218456 A1 Nov. 4, 2004

(30) Foreign Application Priority Data

Apr. 29, 2003 (KR) .............................. 10-2003-0027119

(51) Int. Cl.[7] .............................................. G11C 7/00
(52) U.S. Cl. .............................. 365/230.06; 365/230.03
(58) Field of Search ...................... 365/230.03, 230.06, 365/189.01

(56) References Cited

U.S. PATENT DOCUMENTS 6,046,926 A * 4/2000 Tanaka et al. .............. 365/145
6,414,890 B2 * 7/2002 Arimoto et al. ............ 365/201
6,597,624 B2 * 7/2003 Aritomi .................. 365/230.06

* cited by examiner

Primary Examiner—Vu A. Le
(74) Attorney, Agent, or Firm—Mayer, Brown, Rowe & Maw LLP (57) ABSTRACT

Disclosed is a semiconductor memory device. In the process for the memory cell to reading stored data by selecting specific word lines, word lines neighboring the selected word line are selected at the same time, or the two bit lines are connected at the same time to the input terminals of the sense amplifiers, thus increasing the difference in voltage between both the input terminals of the sense amplifiers. Therefore, the read margin is increased, the exactness of the read operation is increased, and reliability of the device is improved.

11 Claims, 7 Drawing Sheets

SEMICONDUCTOR MEMORY DEVICE

BACKGROUND OF THE INVENTION

1. Field of the Invention

The present invention relates to a semiconductor memory device, and more particularly, to a semiconductor memory device capable of improving reliability of the device by increasing a margin of the read operation for reading data stored at the memory cell.

2. Background of the Related Art

As the degree of integration in the device is increased, the area of the memory cell is reduced. At the same time, there occur several problems for the memory cell to store data.

For example, in case of a DRAM, the memory cell consists of one transistor and one capacitor. Data is stored at the memory cell by a method of charging or discharging the charge into or from the capacitor. In this case, as the size of the capacitor is reduced in order to increase the degree of integration in the degree, time when the charge stored at the capacitor is discharged is shortened. For this reason, there is a difficulty in keeping data for a long period of time.

Figure 1:
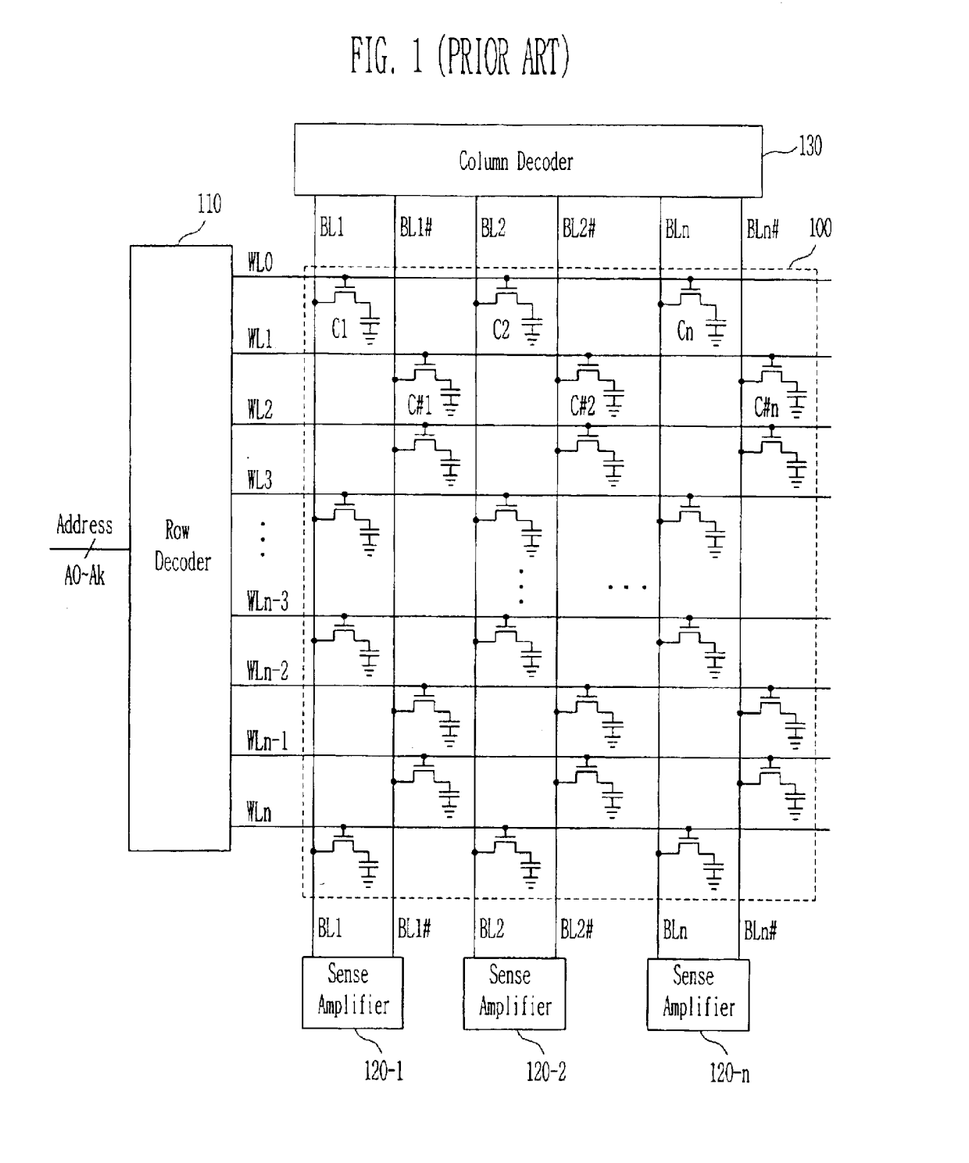
FIG. 1 is a circuit diagram for explaining the read operation of data stored at the memory cell in a common semiconductor memory device.

FIG. 1 is a circuit diagram for explaining the read operation of data stored at the memory cell in a common semiconductor memory device.

Referring to FIG. 1, a memory cell array 100 includes a plurality of word lines WL0~WLn, a plurality of bit lines BL1~BLn and inverted bit lines BL1#~BLn#. The gates of the memory cells in the row direction are commonly connected in the word lines WL0~WLn. The drains of the memory cells in the column direction are commonly connected in the bit lines BL1~BLn and inverted bit lines BL1#~BLn#.

In the concrete, in case of a dynamic semiconductor memory device, true cells C1~Cn connected to the bit lines BL1~BLn and complement cells C#1~C#n connected to the inverted bit lines BL1#~BLn# are positioned zigzag, among the memory cell. In other words, in the memory cell array, the bit lines BL1~BLn and inverted bit lines BL1#~BLn# are alternately arranged and word lines WL0~WLn are arranged in a direction orthogonal to the bit lines BL1~BLn. Furthermore, the memory cells C1~Cn and C#1~C#n are not positioned in a line arrangement of a matrix shape but arranged zigzag.

Meanwhile, the bit line BL1 and inverted bit line BL1# corresponding thereto are each connected to the input terminal of the sense amplifier 120-1. This sense amplifier is provided the same number as the bit line. In this situation, if addresses A0~Ak are inputted, a row decoder 110 decodes the inputted addresses to select one word line. A column decoder 130 selects a specific bit line (or inverted bit line). For example, if the addresses A0~Ak are inputted and a first word line (for example WL0) and first bit line BL1 are selected, the sense amplifier 120-1 compares the reference voltage (for example Vcc/2) inputted through the inverted bit line BL#1 and charge status of the capacitor in the true cell C1 inputted through the bit line BL1 to read data stored at the true cells C1~Cn, respectively. The read data are outputted toward the outside through a data output pin.

At this time, in case where data of '0' is stored since the charge is not charged into the capacitor of the memory cell, data of '0' could be stably kept since there is no any charge to be discharged. Furthermore, during the refresh or read operation, since the difference in the voltage between 0V of the bit line (for example BL1) and Vcc/2 of the inverted bit line (for example BL1#) is clearly different, error in the read operation rarely happens. However, in case where data of '1' is stored since the charge is charged into the capacitor of the memory cell, data of '1' could not be stably kept since the charged charge is discharged as time goes. Therefore, during the refresh or read operation, the sense amplifier (for example 120-1) must compare the difference in the voltage (a) between (a+Vcc/2) of the bit line BL1 that is lower than Vcc and (Vcc/2) of the inverted bit line BL1#. If the difference in the voltage (a) is not high, read error may occur.

Furthermore, if the degree of integration is increased and capacitance of the capacitor is thus reduced, it is required that the refresh period be shortened in order to improve a data retention characteristic. Due to this, there is a problem that current consumption and the defective rate are increased.

SUMMARY OF THE INVENTION

Accordingly, the present invention is contrived to substantially obviate one or more problems due to limitations and disadvantages of the related art.

An object of the present invention is to provide semiconductor memory device capable of increasing the exactness of the read operation and improving reliability of the device operation by increasing a read margin, in such a manner that a word line selected in the process in which the memory cell reads stored data and a word line neighboring it are simultaneously selected, or two bit lines (or inverted bit lines) are simultaneously connected to the input terminal of the sense amplifier to increase the difference in the voltage between both input terminals of the sense amplifier.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor memory device according to an embodiment of the present invention is characterized in that it comprises a memory cell array including a plurality of word lines and a plurality of bit lines to which memory cells are connected, a row decoder for generating a word line select signal, according to an address signal, to simultaneously select two word lines neighboring each other of the plurality of the word lines, a column decoder for selecting one of the plurality of the bit lines, and a plurality of sense amplifiers for sensing data stored at the memory cells selected by the row decoder and the column decoder.

In the above, the row decoder decodes only remaining address signals of the address signals except for a lowest address signal to generate the word line select signal, so that the two neighboring word lines are selected at the same time.

The row decoder generates the word line select signal of a number corresponding to a half of the word line and simultaneously selects two word lines neighboring each other using one word line select signal.

Meanwhile, the row decoder comprises a plurality of inverters for inverting the address signals, and a plurality of NOR gates for combining the address signals and inverted address signals to generate the word line select signals, wherein the ground voltage is instead applied to input terminals of the NOR gates to which the lowest address signal is inputted, whereby the lowest address signal may be processed as "Don't care" in order to enable the word line select signals twice each time so that the two neighboring word lines are selected at the same time. At this time, a switching means for selectively switching either the lowest address signal or the ground voltage to the input terminal of the NOR gate according to a control signal, is further provided at the input terminal of the NOR gate to which the lowest address signal is inputted, whereby if the lowest address signal is inputted, only one word line may be selected and if the ground voltage is inputted, the two word lines may be selected at the same time.

Furthermore, the row decoder comprises a plurality of inverters for inverting the address signals, and a plurality of NAND gates for combining the address signals and inverted address signals to generate the word line select signals, wherein the power supply voltage is instead applied to the input terminals of the NAND gates to which the lowest address signal is inputted, whereby the lowest address signal may be processed as "Don't care" in order to enable the word line select signals twice each time so that the two neighboring word lines are selected at the same time. At this time, a switching means for selectively switching either the lowest address signal or the power supply voltage to the input terminal of the NOR gate according to a control signal is further provided at the input terminal of the NOR gate to which the lowest address signal is inputted, whereby if the lowest address signal is inputted, only one word line may be selected and if the ground voltage is inputted, the two word lines may be selected at the same time.

In the above, one of the two neighboring word lines is a word line to which true cells connected to the bit lines are connected and the other of the word lines is a word line to which complement cells connected to the inverted bit lines are connected. At this time, the true cells are connected to first input terminals of the sense amplifiers through the bit lines and the complement cells are connected to second input terminals of the sense amplifiers through the inverted bit lines, whereby stored data are read.

Furthermore, the two neighboring word lines may be word lines to which only true cells connected to the bit lines are connected, or word lines to which only complement cells connected to inverted bit lines are connected. At this time, the true cells or the complement cells are connected to first input terminals of the sense amplifiers and a reference voltage is applied to second input terminals of the sense amplifiers, whereby stored data are read.

A semiconductor memory device according to an embodiment of the present invention is characterized in that it comprises a memory cell array including a plurality of word lines, a plurality of bit lines and a plurality of inverted bit lines to which memory cells are connected, a row decoder for selecting one of the plurality of the word lines, a column decoder for generating a bit line select signal, according to an address signal, to simultaneously select two bit lines neighboring each other of the plurality of the bit lines, or two inverted bit lines neighboring each other of the plurality of the inverted bit lines, and a plurality of sense amplifiers for sensing data stored at the memory cells selected by the row decoder and the column decoder, wherein the two neighboring bit lines and the two neighboring inverted bit lines are each connected in parallel to different input terminals of the sense amplifiers.

In the above, the column decoder decodes only remaining address signals of the address signals except for a lowest address signal to generate the bit line select signal, so that the two neighboring bit lines or the two neighboring inverted bit lines are selected at the same time.

The column decoder may generate the bit line select signal of a number corresponding to a half of the bit line and may simultaneously select the two neighboring word lines using one bit line select signal.

Meanwhile, the column decoder comprises a plurality of inverters for inverting the address signals, and a plurality of NOR gates for combining the address signals and inverted address signals to generate the bit line select signals, wherein the ground voltage is instead applied to input terminals of the NOR gates to which the lowest address signal is inputted, whereby the lowest address signal may be processed as "Don't care" in order to enable the bit line select signals twice each time so that the two neighboring bit lines are selected at the same time.

Furthermore, the column decoder comprises a plurality of inverters for inverting the address signals, and a plurality of NAND gates for combining the address signals and inverted address signals to generate the bit line select signals, wherein the power supply voltage is instead applied to the input terminals of the NAND gates to which the lowest address signal is inputted, whereby the lowest address signal may be processed as "Don't care" in order to enable the bit line select signals twice each time so that the two neighboring bit lines are selected at the same time.

The semiconductor memory device of the present invention constructed above simultaneously selects two bit lines or two word line neighboring each other to simultaneously connected them to the input terminal of the sense amplifier, and then increases the difference in voltage between the both input terminals of the sense amplifier, in a normal operation or a refresh operation. Therefore, a read margin could be increased, the exactness of a read operation could be increased and reliability of the device operation could be improved.

In another aspect of the present invention, it is to be understood that both the foregoing general description and following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings, in which like reference numerals are used to identify the same or similar parts.

Figure 2:
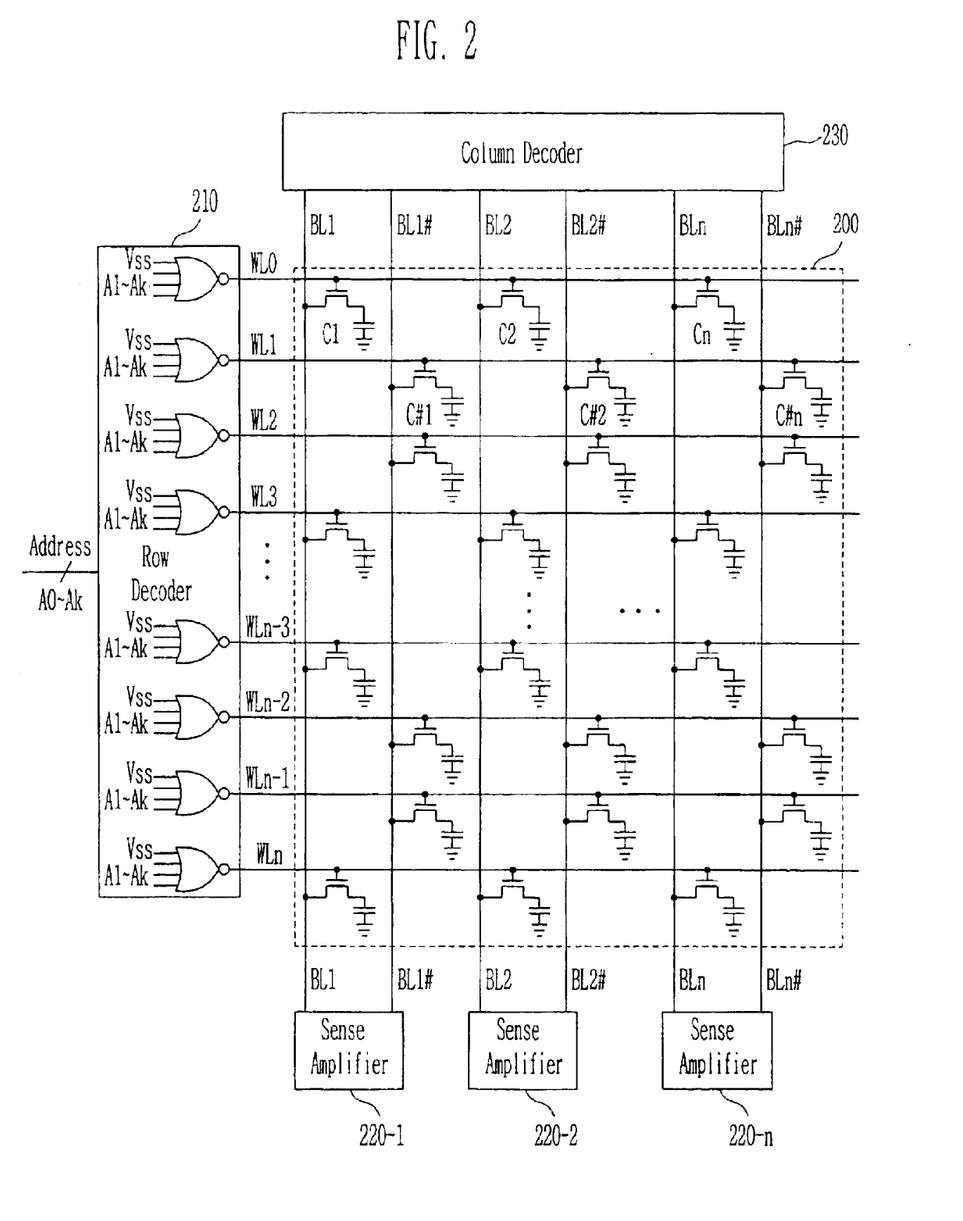
FIG. 2 is a circuit diagram for explaining connection relationship and operation of a semiconductor memory device according to a first embodiment of the present invention.

FIG. 2 is a circuit diagram for explaining connection relationship and operation of a semiconductor memory device according to a first embodiment of the present invention.

Referring to FIG. 2, in the semiconductor memory device according to the first embodiment of the present invention, a memory cell array 200, sense amplifiers 220-1~220-n, a column decoder 230 and peripheral circuits (not shown) are same to the conventional ones. For simplicity, explanation on them will be omitted.

Meanwhile, in the normal operation or refresh operation, as one of methods for simultaneously selecting two neighboring word lines, the two neighboring word lines may be simultaneously selected by changing an internal circuit of the row decoder 210. An operation of simultaneously selecting the internal circuit of the row decoder 210 and two neighboring word lines will be described by reference to the drawings.

Figure 3:
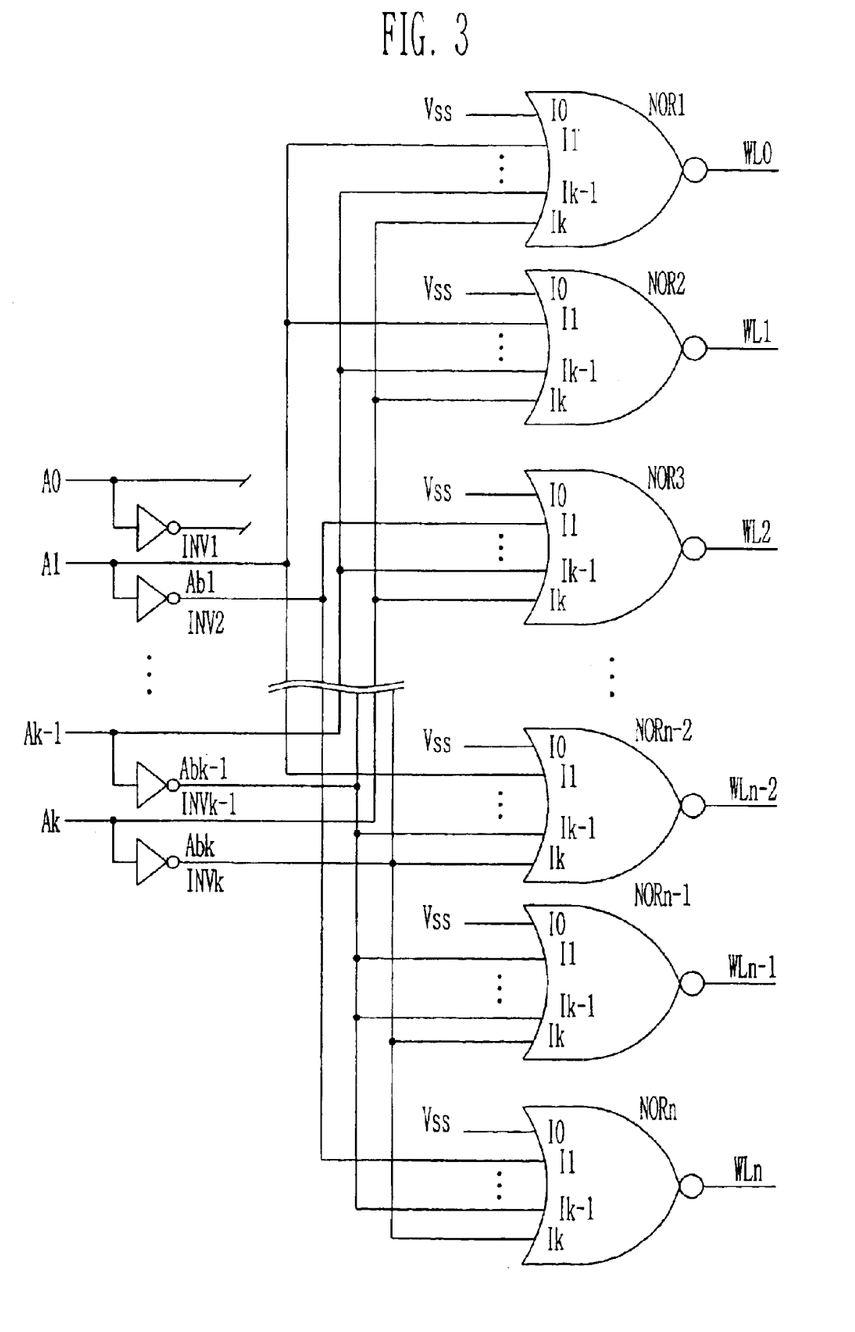
FIG. 3 illustrates an internal circuit of the row decoder shown in FIG. 2.

FIG. 3 illustrates the internal circuit of the row decoder shown in FIG. 2.

By reference to FIG. 3, the row decoder according to the embodiment of the present invention may comprise a plurality of inverters INV1~INVk and a plurality of NOR gates NOR1~NORn. At this time, the plurality of the inverters INV1~INVk invert first~(k+1)$^{th}$ address signals A0~Ak to generate inverted address signals Ab1~Abk.

In the above, the conventional NOR gate logically combined the first~(k+1)$^{th}$ address signals A0~Ak and inverted address signals Ab0~Abk to generate signals for selecting the word lines. In the present invention, however, the plurality of the NOR gates NOR1~NORn logically combines only the second~(k+1)$^{th}$ address signals A1~Ak and inverted address signals Ab1~Abk to generate a signal for selecting one of the word lines WL0~WLn. In other words, the lowest address signal A0 is not decoded. Furthermore, the first input terminals I0 of the NOR gate NOR0~NORn to which the lowest address signal A0 was inputted are connected to the ground voltage terminals, so that the ground voltage Vss is inputted thereto instead of the lowest address signal A0. By doing so, the lowest address signal A0 is not inputted but the ground voltage Vss does not affect the operation of the NOR gates. Accordingly, the lowest address signal A0 is processed as "Don't care" and word line select signals are enabled twice each time. If the row decoder consists of a NAND gate instead of the NOR gate, the first input terminals of the NAND gates to which the lowest address signal A0 was inputted are connected to the power supply voltage terminals, so that the power supply voltage Vcc is inputted instead of the lowest address signal A0. By doing so, the lowest address signal A0 is not inputted and power supply voltage Vcc does not affect the operation of the NAND gate. Accordingly, the lowest address signal A0 is processed as "Don't care" and word line select signals are enable twice each time.

For example, a true table in case that the first~third addresses A0~A2 are inputted and lowest first addresses A0 is processed as "Don't care" is as follows.

TABLE 1

| A2 | A1 | A0 | Enable Signal |
|----|----|----|----|
| 0 | 0 | Don't care | WL0, WL1 |
| 0 | 0 | Don't care | WL0, WL1 |
| 0 | 1 | Don't care | WL2, WL3 |
| 0 | 1 | Don't care | WL2, WL3 |
| 1 | 0 | Don't care | WL4, WL5 |
| 1 | 0 | Don't care | WL4, WL5 |
| 1 | 1 | Don't care | WL6, WL7 |
| 1 | 1 | Don't care | WL6, WL7 |

As in Table 1, if the address signals A0~A2 of 3 bits are inputted, a total of eight word lines WL0~WL7 could be selected respectively. It could be seen that the word lines are enabled twice each time when the lowest address signal A0 is processed as "Don't care". This means that if the lowest address signal is processed as "Don't care" as shown in FIG. 3, the word lines could be enabled twice each time regardless of the bit number of the address signal. Therefore, if the lowest two address signals A0 and A1 are processed as "Don't care", four word lines could be enabled at the same time.

Meanwhile, though not shown in the drawing, a switching means may be provided between the input terminal of the lowest address signal A0 and first input terminals I0 of the NOR gates NOR0~NORn to which the lowest address signal is inputted. The switching means is then controlled, according to a control signal, to selectively input the lowest address signal A0 or the ground voltage Vss (in case of the NAND gate, Vcc) to the first input terminals I0 of the NOR gates NOR0~NORn. As such, the switching means could be controlled to select one of the word lines by inputting the lowest address signal A0 or the two word lines simultaneously by inputting the ground voltage Vss.

Turning to FIG. 2 and FIG. 3, if two word lines neighboring each other are simultaneously enabled by the row decoder 210 according to the address signals A0~Ak, the two memory cells are each connected to the sense amplifiers 220-1~220-n.

For instance, if the first and second word lines WL0 and WL1 are selected at the same time and the first bit line BL1 and the first inverted bit line BL#1 are selected by the column decoder 230, the first true cell C1 connected to the first word line WL0 is connected to the first input terminal of the sense amplifier 220-1 through the first bit line BL1. Also, the first complement cell C#1 being a cell connected to the second word line WL1 is connected to the second input terminal of the sense amplifier 220-1 through the first inverted bit line BL#1. As such, if the cells C1 and C#1 at which data values opposite each other are stored are each connected to the different input terminals of the sense amplifier 220-1, the difference in voltage between the input terminals is increased. Accordingly, a read margin of the sense amplifiers 220-1 could be increased and the exactness of the read operation or the refresh operation could be increased, so that reliability of the device could be increased.

In the first embodiment, a case where the true cell C1 is connected to the word line WL0 of the two word lines and the complement cell C#1 is connected to the word line WL1 of the two word lines has been described. However, those having skill in the art will appreciate that the present invention could be applied to a case where only the true cell is connected to the selected two word lines. This will be now described.

Figure 4:
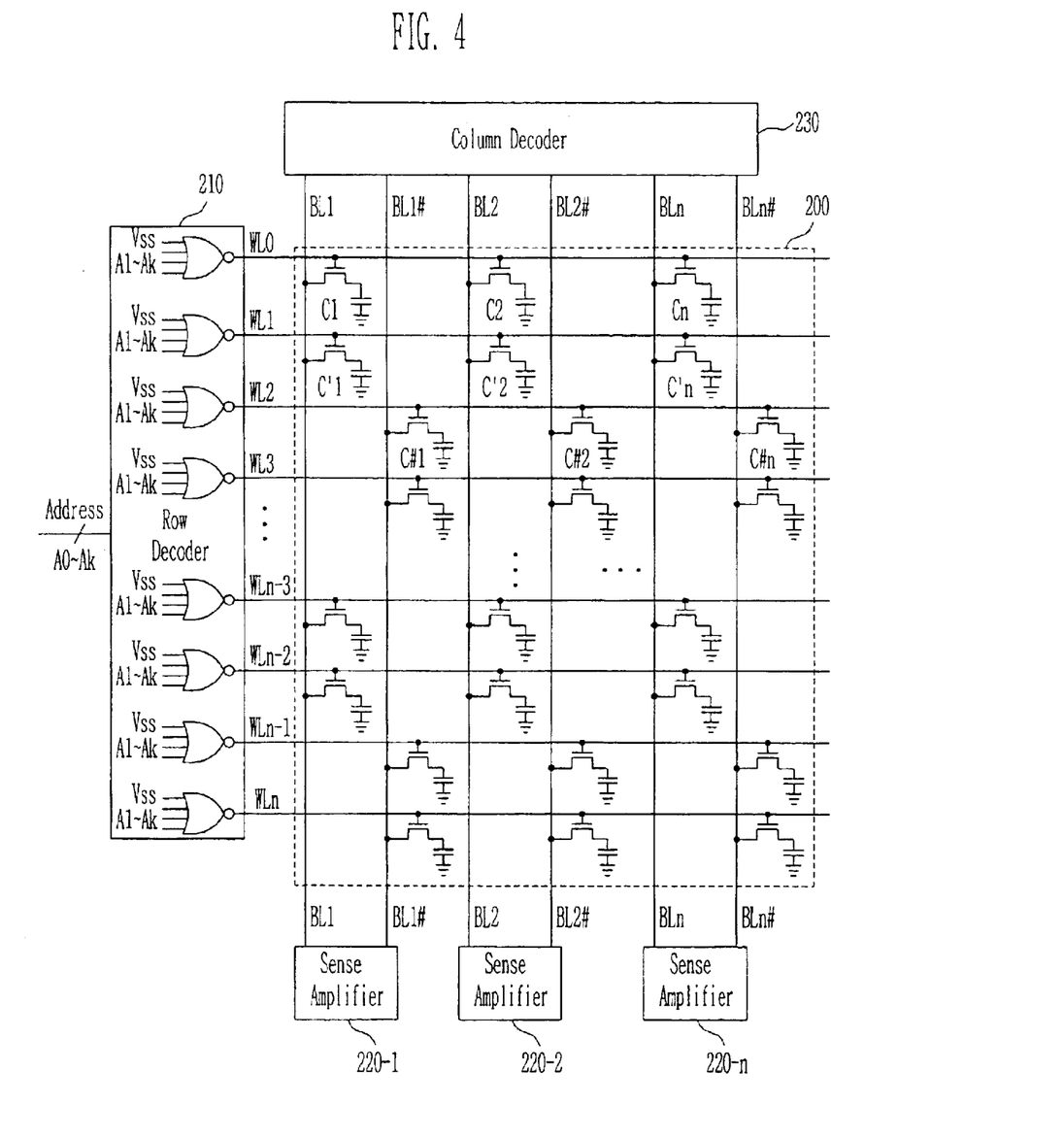
FIG. 4 is a circuit diagram for explaining connection relationship and operation of a semiconductor memory device according to a second embodiment of the present invention.

FIG. 4 is a circuit diagram for explaining connection relationship and operation of the semiconductor memory device according to a second embodiment of the present invention.

Referring to FIG. 4, all connection relationship are same to those in the semiconductor memory device described by reference to FIG. 2 but arrangement of the true cells C1~Cn and C'1~C'n and the complement cells C#1~C#n are quite different. In the concrete, in FIG. 2, if two word lines neighboring each other are selected, the memory cell is arranged in one word line such that the word line to which the true cell is connected and the word line to which the complement cell is connected are selected at the same time. As in FIG. 4, however, the memory cell may be arranged such that the two neighboring word lines to which only the true cell or the complement cell is connected may be selected at the same time.

If the two word lines adjacent to the address signals A0~Ak are simultaneously enabled by the row decoder 210, the two true cells are connected to the sense amplifiers 220-1~220-n, respectively, by the above arrangement.

For example, if the first and second word lines WL0 and WL1 are selected at the same time and the first bit line BL1 and the first inverted bit line BL#1 are activated by the column decoder 230, the first true cell C1 connected to the first word line WL0 and the second true cell C'1 connected to the second word line WL1 are connected to the first input terminal of the sense amplifier 220-1 through the bit line BL1. As such, the first and second true cells C1 and C'1 are connected in parallel. Meanwhile, a reference voltage (for example Vcc/2) is applied to the second input terminal through the inverted bit line BL#1. If the first and second true cells C1 and C'1 are connected in parallel to the first input terminal of the sense amplifier 220-1, the capacitors included in the first and second true cells C1 and C'1 are connected in parallel to the first input terminal of the sense amplifier 220-1. Since a total capacitance is increased when the capacitors are connected in parallel, the difference in voltage between the input terminals is increased. Accordingly, a read margin of the sense amplifiers 220-1 could be increased and the exactness of the read operation or the refresh operation could be increased, so that reliability of the device could be increased.

In the first and second embodiments shown in FIG. 2~FIG. 4, a case where the two word lines are simultaneously selected by the row decoder in order to increase the read margin has been described. However, it should be understood that the read margin may bee increased by means of a method of applying the word line select signal generated in the row decoder to the two word lines to select the two word lines. This will be described below.

Figure 5:
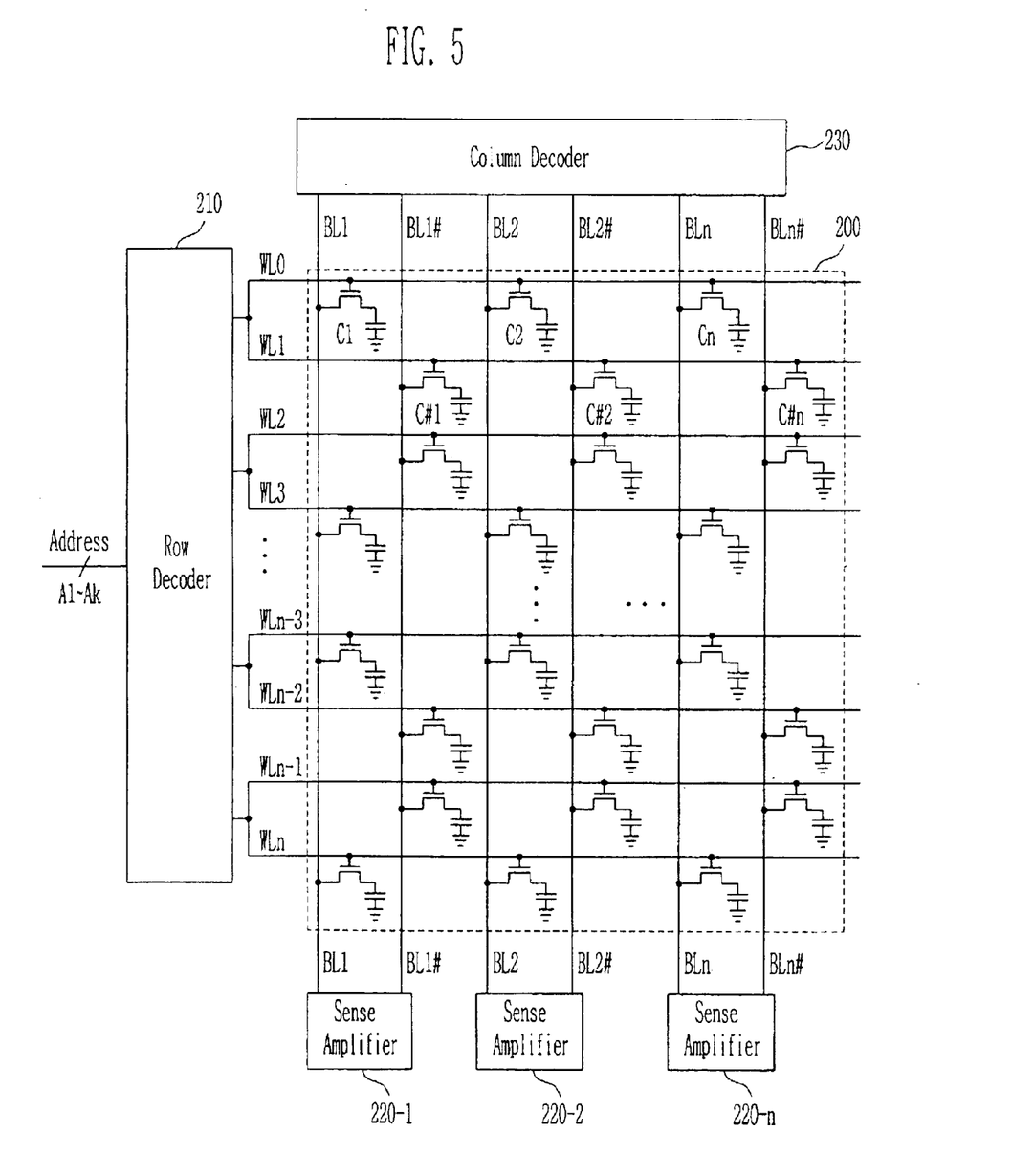
FIG. 5 is a circuit diagram for explaining connection relationship and operation of a semiconductor memory device according to a third embodiment of the present invention.
Figure 6:
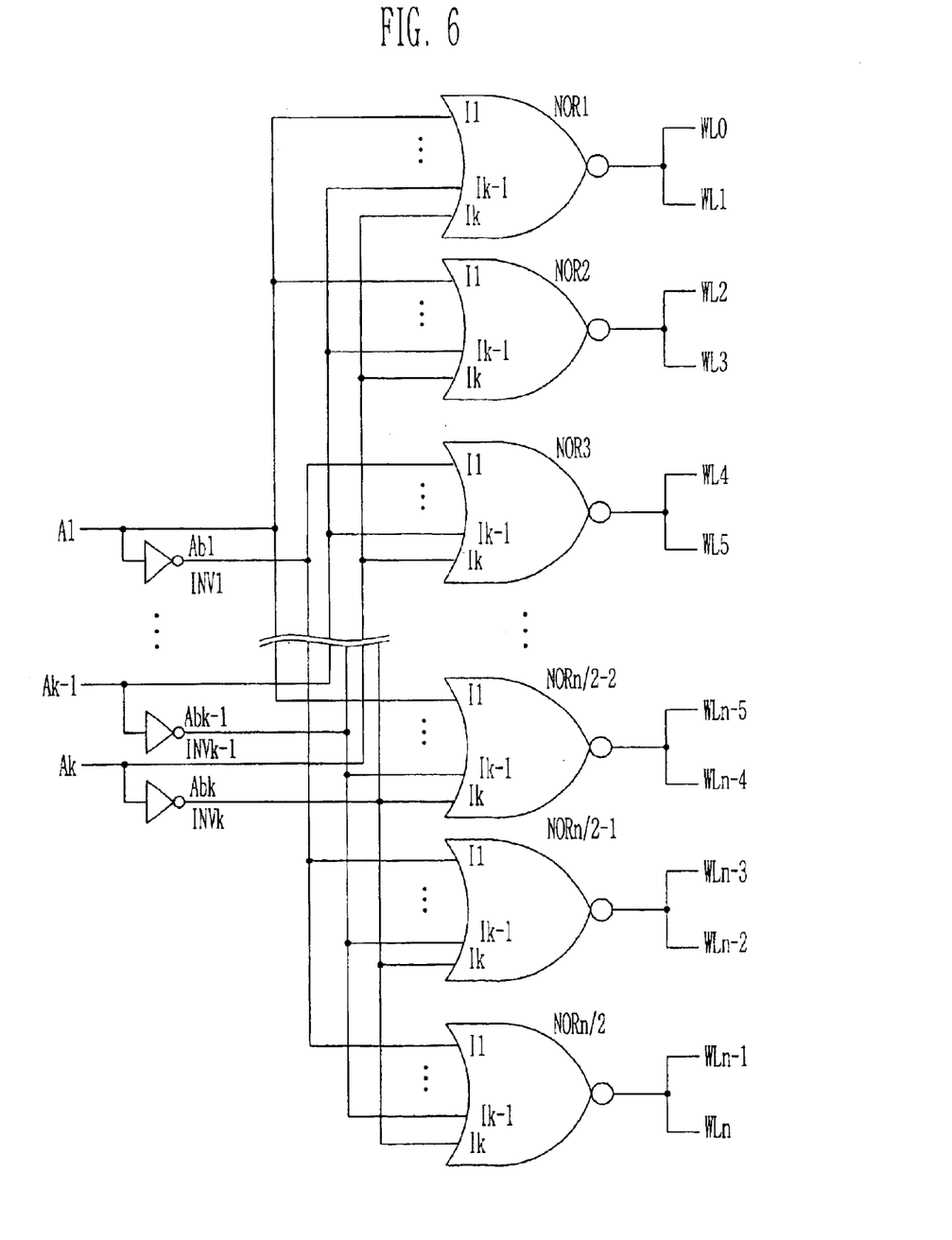
FIG. 6 illustrates an internal circuit of the row decoder shown in FIG. 5.

FIG. 5 is a circuit diagram for explaining connection relationship and operation of the semiconductor memory device according to a third embodiment of the present invention. FIG. 6 illustrates an internal circuit of the row decoder shown in FIG. 5.

The third embodiment of FIG. 5 is same to the second embodiment of FIG. 2 except that only the remaining addresses A1~Ak of the addresses A0~Ak except for the lowest address A0 are decoded to generate the word line select signal and that the word line select signal generated in the row decoder 210 selects the two word lines at the same time. This will be explained in detail below.

In the third embodiment, only the addresses A1~Ak except for the lowest address A0 are decoded to generate a signal for selecting the word line. At this time, if only the remaining addresses A1~Ak except for the lowest address A0 are decoded, the number of the NOR gate is reduced by half and the size of the row decoder 210 is thus reduced. However, the number of the output of the word line select signal is reduced by half as many as the number of the NOR gate is reduced. If two word lines neighboring each other are selected simultaneously by simultaneously applying one word line select signal to the two word lines although the number of the output of the word line select signal is reduced, all the word lines could be selected with only the word line select signal that was reduced by half.

In order to simultaneously apply one word line select signal to the two neighboring word lines, it is required that the ends of the neighboring word lines are connected and then connected to the output terminals (for example, output terminals of the NOR gates) of the row decoder 210.

Another example will be described by reference to FIG. 6. Although the number (n/2 number) of the NOR gates NOR1~NORn/2 is reduced by half compared to the number (n number) of the word lines WL0~WLn, if outside output terminals are installed in the row decoder 210 itself as many as the number of the word lines WL0~WLn and are each connected to the word lines WL0~WLn and the output terminals of the NOR gates NOR1~NORn/2 are each connected to the two outside output terminals within the row decoder 210, the two word lines (for example, WL0 and WL1) could be simultaneously selected using one word line select signal (for example, output signal of the NOR gate NOR1).

By doing so, the same effect to process the lowest address A0 as "Don't care" like the first embodiment of FIG. 2 could be obtained while reducing the size of the row decoder 210. Furthermore, the principle that the read margin is increased and the exactness of the read operation or the refresh operation is increased to improve reliability of the device, during the operation of reading or refreshing data stored at the memory cell by selecting a specific word line and a specific bit line, are same to the first embodiment of FIG. 2.

In the third embodiment, a case where the true cell is connected to one word line of the selected two word lines and the complement cell is connected to the word line of the two word lines has been described. As the fourth embodiment, however, like the arrangement of the memory cell in the second embodiment of FIG. 4, the present invention could be applied to a case where only the true cell is connected to the selected two word lines. Even in the fourth embodiment, the operation of reading or refreshing data stored at the memory cell by selecting a specific word line and a specific bit line, or the principle that the read margin is increased and the exactness of the read operation or the refresh operation is increased to improve reliability of the device, are same to the second embodiment of FIG. 4. Therefore, detailed explanation on them will be omitted for simplicity.

Meanwhile, in the first~fourth embodiments, the read margin is increased to increase the exactness of the read operation or the refresh operation and to increase reliability of the device, by the method of simultaneously selecting the two word lines. Those effects could be obtained by a method of simultaneously selecting two bit lines (or two inverted bit lines, inverted bit lines included hereinafter). Embodiments of the semiconductor memory devices for simultaneously selecting the two bit lines will be described below.

Figure 7:
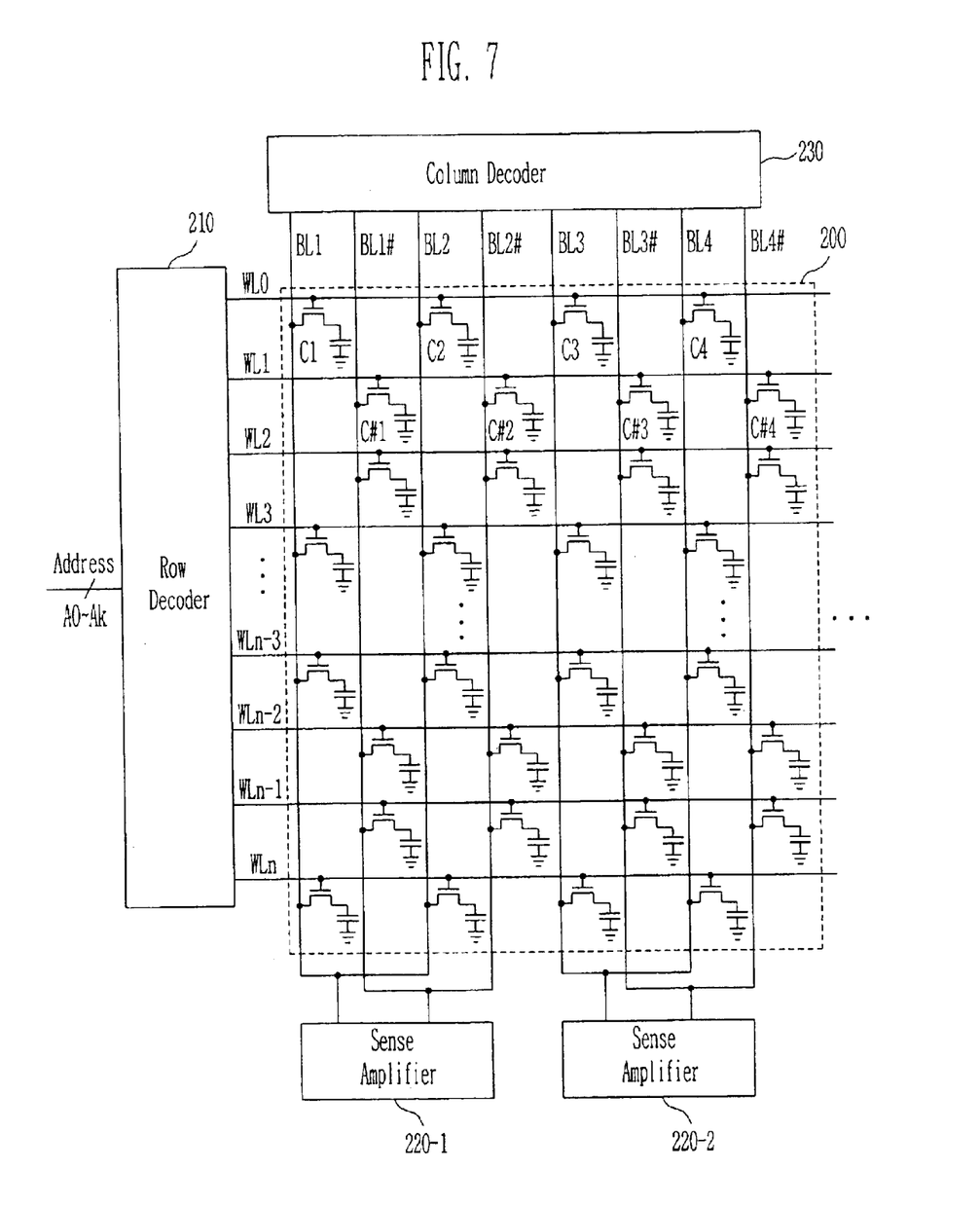
FIG. 7 is a circuit diagram for explaining connection relationship and operation of a semiconductor memory device according to a fourth embodiment of the present invention.

FIG. 7 is a circuit diagram for explaining connection relationship and operation of the semiconductor memory device according to a fourth embodiment of the present invention.

Turning to FIG. 7, in the semiconductor memory device according to the fourth embodiment of the present invention, two bit lines neighboring each other (for instance, BL1 and BL2) are connected in parallel to the first input terminal of the sense amplifier (for example 220-1) and two inverted bit lines neighboring each other (for example BL#1 and BL#2) are connected in parallel to the second input terminal of the sense amplifier 220-1. Unlike the prior art or the first~fourth embodiments, in the normal operation or refresh operation, it is required that the row decoder 210 select only one word line (for example WL0) and the column decoder 130 simultaneously select the two bit lines BL1 and BL2 to apply the bit line voltage.

In this case, if the first word line WL0 is selected by the row decoder 210 and the first and second bit lines BL1 and BL2, neighboring each other, are simultaneously selected by the column decoder 230, the first and second true cells C2 connected to the first word line WL0 are connected in parallel to the first input terminal of the sense amplifier 220-1 through the first and second bit lines BL1 and BL2. Meanwhile, the reference voltage (for example Vcc/2) is applied to the second input terminal through the first and second inverted bit lines BL#1 and BL#2. If the first and second true cells C1 and C2 are connected in parallel to the first input terminal of the sense amplifier 220-1, the capacitors included in the first and second true cells C1 and C2 are connected in parallel to the first input terminal of the sense amplifier 220-1. If the capacitors are connected in parallel, a total capacitance is increased. The difference in voltage between the input terminals is thus increased. Accordingly, the read margin of the sense amplifier 220-1 and the exactness of the read operation or the refresh operation are increased and reliability of the device is increased.

As such, with one of methods for simultaneously selecting the two neighboring bit lines in the normal operation or the refresh operation, the two neighboring bit line can be simultaneously selecting by changing the internal circuit of the column decoder 230. In other words, with the same method described in the first embodiment of FIG. 2 and FIG. 3 and the second embodiment of FIG. 4, if the internal circuit of the column decoder 230 is changed by a method of decoding only the remaining address signals except for the lowest address signal that are inputted to the column decoder 230, the two neighboring bit lines could be selected simultaneously.

Meanwhile, if the semiconductor memory device according to the fourth embodiment is modified a little by applying the technical contents described in the first~third embodiments, the semiconductor memory device according to the fourth embodiment could be applied even the arrangement of the memory cell is changed like in the second embodiment of FIG. 4.

As described above, according to the present invention, the difference in voltage between both the input terminals of the sense amplifier is increased by simultaneously selecting the word lines adjacent to the selected word lines or simultaneously connecting the two bit lines (or inverted bit lines) to the input terminal of the sense amplifier, in the process of reading data stored at the memory cell by selecting the word line. Therefore, the present invention has advantageous effects that it can increase the read margin and the exactness of the read operation and improve reliability of the device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor memory device, comprising:
    a memory cell array including a plurality of word lines and a plurality of bit lines to which memory cells are connected;
    a row decoder for generating a word line select signal, according to an address signal, to simultaneously select two word lines neighboring each other of the plurality of the word lines;
    a column decoder for selecting one of the plurality of the bit lines; and
    a plurality of sense amplifiers for sensing data stored at the memory cells selected by the row decoder and the column decoder.

2. The semiconductor memory device as claimed in claim 1, wherein the row decoder decodes only remaining address signals of the address signals except for a lowest address signal to generate the word line select signal, so that the two neighboring word lines are selected at the same time.

3. The semiconductor memory device as claimed in claim 2, wherein the row decoder generates the word line select signal of a number corresponding to a half of the word line and simultaneously selects the two neighboring word lines using one word line select signal.

4. The semiconductor memory device as claimed in claim 1, wherein the row decoder comprises:
    a plurality of inverters for inverting the address signals; and
    a plurality of NOR gates for combining the address signals and inverted address signals to generate the word line select signals, wherein the ground voltage is instead applied to input terminals of the NOR gates to which the lowest address signal is inputted,
    whereby the lowest address signal is processed as "Don't care" in order to enable the word line select signals twice each time so that the two neighboring word lines are selected at the same time.

5. The semiconductor memory device as claimed in claim 4, wherein the row decoder further comprises a switching means provided at the input terminal of the NOR gate to which the lowest address signal is inputted, for selectively switching either the lowest address signal or the ground voltage to the input terminal of the NOR gate according to a control signal, whereby if the lowest address signal is inputted, only one word line is selected and if the ground voltage is inputted, the two word lines are selected at the same time.

6. The semiconductor memory device as claimed in claim 1, wherein the row decoder comprises:
    a plurality of inverters for inverting the address signals; and
    a plurality of NAND gates for combining the address signals and inverted address signals to generate the word line select signals, wherein the power supply voltage is instead applied to the input terminals of the NAND gates to which the lowest address signal is inputted,
    whereby the lowest address signal is processed as "Don't care" in order to enable the word line select signals twice each time so that the two neighboring word lines are selected at the same time.

7. The semiconductor memory device as claimed in claim 6, wherein the row decoder further comprises a switching means provided at the input terminal of the NOR gate to which the lowest address signal is inputted, for selectively switching either the lowest address signal or the power supply voltage to the input terminal of the NOR gate according to a control signal, whereby if the lowest address signal is inputted, only one word line is selected and if the ground voltage is inputted, the two word lines are selected at the same time.

8. The semiconductor memory device as claimed in claim 1, wherein one of the two neighboring word lines is a word line to which true cells connected to the bit lines are connected and the other of the word lines is a word line to which complement cells connected to the inverted bit lines are connected.

9. The semiconductor memory device as claimed in claim 8, wherein the true cells are connected to first input terminals of the sense amplifiers through the bit lines and the complement cells are connected to second input terminals of the sense amplifiers through the inverted bit lines, whereby stored data are read.

10. The semiconductor memory device as claimed in claim 1, wherein the two neighboring word lines are word lines to which only true cells connected to the bit lines are connected, or word lines to which only complement cells connected to inverted bit lines are connected.

11. The semiconductor memory device as claimed in claim 10, wherein the true cells or the complement cells are connected to first input terminals of the sense amplifiers and a reference voltage is applied to second input terminals of the sense amplifiers, whereby stored data are read.

* * * * *